(12) United States Patent
Li

(10) Patent No.: US 10,707,444 B2
(45) Date of Patent: Jul. 7, 2020

(54) OLED DISPLAY PANEL ENCAPSULATION STRUCTURE AND OLED DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Zhao Li, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/303,154

(22) PCT Filed: Aug. 22, 2018

(86) PCT No.: PCT/CN2018/101805
§ 371 (c)(1),
(2) Date: Nov. 20, 2018

(87) PCT Pub. No.: WO2020/010672
PCT Pub. Date: Jan. 16, 2020

(65) Prior Publication Data
US 2020/0020884 A1 Jan. 16, 2020

(30) Foreign Application Priority Data
Jul. 12, 2018 (CN) .......................... 2018 1 0765037

(51) Int. Cl.
*H01L 51/52* (2006.01)
*H01L 51/50* (2006.01)

(52) U.S. Cl.
CPC ...... *H01L 51/5256* (2013.01); *H01L 51/5012* (2013.01)

(58) Field of Classification Search
CPC .................................................. H01L 51/5256
USPC ........................................................ 313/512
See application file for complete search history.

(56) References Cited

U.S. PATENT DOCUMENTS

| 2012/0022181 | A1 | 1/2012 | Xu et al. |
| 2015/0053951 | A1* | 2/2015 | Riegel ................ H01L 51/5268 257/40 |
| 2015/0263311 | A1 | 9/2015 | Park |
| 2016/0095172 | A1* | 3/2016 | Lee ...................... C23C 16/401 313/504 |

(Continued)

FOREIGN PATENT DOCUMENTS

| CN | 102337052 A | 2/2012 |
| CN | 104681586 A | 6/2015 |

(Continued)

*Primary Examiner* — Christopher M Raabe
(74) *Attorney, Agent, or Firm* — Mark M. Friedman

(57) ABSTRACT

An organic light emitting diode (OLED) display panel encapsulation structure includes a first inorganic layer, a first organic layer and a second inorganic layer stacked with one another. The organic layer is an ambipolar layer and the ambipolar layer is made of organic copolymer. Molecules of the organic copolymer have hydrophilic groups and hydrophobic groups. The present invention further provides an OLED display device including a substrate, a thin-film transistor driver layer, an OLED luminescent layer, and an OLED display panel encapsulation structure.

17 Claims, 2 Drawing Sheets

(56) References Cited

U.S. PATENT DOCUMENTS

2016/0259256 A1* 9/2016 Cote .................... G03G 5/0539
2018/0233700 A1* 8/2018 Li ....................... H01L 51/5256

FOREIGN PATENT DOCUMENTS

| CN | 105047831 A | 11/2015 |
| CN | 109065744 A | 12/2018 |

* cited by examiner

OLED DISPLAY PANEL ENCAPSULATION STRUCTURE AND OLED DISPLAY DEVICE

FIELD OF INVENTION

The present invention relates to a display, and more specifically, to an OLED display panel encapsulation structure and an OLED display device having an OLED display panel encapsulation structure.

BACKGROUND OF INVENTION

Over the last few years, organic light emitting diodes (OLED) have several advantages such as self-luminescence, quick response times, wide viewing angles, high brightness, light, and thin. Thus, the OLED potential market future is greatly expected.

However, OLED devices are sensitive to water and oxygen. Penetration of water and oxygen greatly negatively influences products lives. That is why effective encapsulating matters. Nowadays, in a conventional OLED display panel encapsulation structure, inorganic layers are hydrophilic and organic layers are hydrophobic. Therefore, during manufacturing of organic layers, the ink for inkjet printing is difficult to flow and spread uniformly on the inorganic layers and easy to form ink droplets on the inorganic layers. Furthermore, organic layers may have cavities. Water, oxygen and impurities from outer environment may penetrate into the OLED display panel through the cavities to result in a shorter product life and oxidation of OLED device.

In summary, a new OLED display panel encapsulation structure shall be provided to solve issues described above. For example, the ink for inkjet printing is difficult to flow and spread uniformly on the inorganic layers and easy to form ink droplets on the inorganic layers. Furthermore, organic layers may have cavities and water, oxygen and impurities from outer environment may penetrate into the OLED display panel through the cavities to result in a shorter product life and oxidation of OLED device.

SUMMARY OF INVENTION

An object of the present disclosure is to provide an organic light emitting diode (OLED) display panel encapsulation structure to solve issues described above. For example, organic layers may have cavities and water, oxygen and impurities from outer environment may penetrate into the OLED display panel by the cavities to result in a shorter product life and oxidation of OLED device.

In order to solve those issues described above, the present invention provides a solution described as below.

To achieve the above object, an embodiment of the present disclosure is provided. An organic light emitting diode (OLED) display panel encapsulation structure comprises a first inorganic layer, a first organic layer and a second inorganic layer stacked with one another. The first organic layer is an ambipolar layer and the ambipolar layer is made of organic copolymer, molecules of the organic copolymer have hydrophilic groups and hydrophobic groups, and a periphery of the second inorganic layer and a periphery of the first inorganic layer connect with each other.

In a preferred embodiment of the present disclosure, the first inorganic layer is made of silicon nitride or aluminum oxide.

In a preferred embodiment of the present disclosure, the second inorganic layer is made of silicon nitride or silicon dioxide.

In a preferred embodiment of the present disclosure, a thickness of the first inorganic layer is 0.1-2 μm.

In a preferred embodiment of the present disclosure, a thickness of the first organic layer is greater than a thickness of the first inorganic layer and a thickness of the second inorganic layer is same as a thickness of the first inorganic layer.

In a preferred embodiment of the present disclosure, the first organic layer is formed on the first inorganic layer by utilizing a spray technology.

In a preferred embodiment of the present disclosure, ink used in the spray technology is made of a composition comprising alkenoic acid ester organic substance, alkenoic acid organic substance and photopolymerization initiator.

In a preferred embodiment of the present disclosure, a mass percentage of the alkenoic acid organic substance is 0.1%-10%.

To achieve the above object, an embodiment of the present disclosure is provided. An OLED display device comprises a substrate, a thin-film transistor driver layer, an OLED luminescent layer, and an OLED display panel encapsulation structure. The OLED display panel encapsulation structure comprises a first inorganic layer, a first organic layer and a second inorganic layer stacked with one another. The first organic layer is an ambipolar layer. The ambipolar layer is made of organic copolymer. Molecules of the organic copolymer have hydrophilic groups and hydrophobic groups.

To achieve the above object, an embodiment of the present disclosure is provided. An OLED display panel encapsulation structure, comprises a first inorganic layer, a first organic layer and a second inorganic layer stacked with one another. The first organic layer is an ambipolar layer. The ambipolar layer is made of organic copolymer. Molecules of the organic copolymer have hydrophilic groups and hydrophobic groups.

In a preferred embodiment of the present disclosure, the first inorganic layer is made of silicon nitride or aluminum oxide.

In a preferred embodiment of the present disclosure, the second inorganic layer is made of silicon nitride or silicon dioxide.

In a preferred embodiment of the present disclosure, a thickness of the first inorganic layer is 0.1-2 μm.

In a preferred embodiment of the present disclosure, a thickness of the first organic layer is greater than a thickness of the first inorganic layer and a thickness of the second inorganic layer is same as a thickness of the first inorganic layer.

In a preferred embodiment of the present disclosure, the first organic layer is formed on the first inorganic layer by utilizing a spray technology.

In a preferred embodiment of the present disclosure, ink used in the spray technology is made of a composition comprising alkenoic acid ester organic substance, alkenoic acid organic substance and photopolymerization initiator.

In a preferred embodiment of the present disclosure, a mass percentage of the alkenoic acid organic substance is 0.1%-10%.

The present invention provides an OLED display panel encapsulation structure. By utilizing the organic layer as an ambipolar layer to decrease the cavities in the organic layer. Thus, the organic layer is able to isolate water and oxygen better and to reduce the risk of oxidation of OLED device and result in longer product life of the OLED device.

The accompanying figures in the description of embodiments of the present disclosure will be described in brief to more clearly illustrate the technical solutions of the embodiments.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
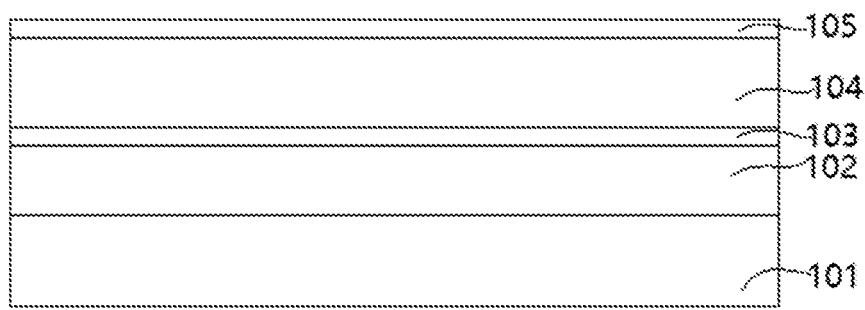
FIG. 1 is a schematic diagram of an OLED display panel encapsulation structure according to the present invention.

The embodiments of the present disclosure are described in detail hereinafter. Examples of the described embodiments are given in the accompanying drawings, wherein the identical or similar reference numerals constantly denote the identical or similar elements or elements having the identical or similar functions. In the description of the present disclosure, it should be understood that terms such as "upper," "lower," "front," "rear," "left," "right," "inside," "outside," "lateral," as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure.

An object of the present invention is to provide an organic light emitting diode (OLED) display panel encapsulation structure to solve issues described above. For example, during manufacture process of organic layers, the ink in inkjet printing is difficult to flow uniformly on the inorganic layers and easy to form ink droplets on the inorganic layers. Organic layers may have cavities. Water, oxygen and impurities from outer environment may penetrate into the OLED display panel by the cavities to result in a shorter product life and oxidation of OLED device. In order to solve those issues described above, the present invention provides a solution described as below.

Refer to FIG. 1, the present invention provides an organic light emitting diode (OLED) display panel encapsulation structure. The OLED display panel encapsulation structure comprises a first inorganic layer 103, a first organic layer 104 and a second inorganic layer 105 stacked with one another.

The first inorganic layer 103 is formed on the substrate 101 and the OLED device 102 is formed between the first inorganic layer 103 and the substrate 101. The first organic layer 104 is formed on the first inorganic layer 103. A periphery of the second inorganic layer 105 and a periphery of the first inorganic layer 103 connect with each other.

In a preferred embodiment of the present disclosure, the OLED device 102 is formed on the substrate 101. The first inorganic layer 103 is formed on the OLED device 102. Preferably, the substrate 101 is a flexible substrate. The first inorganic layer 103 is made of inorganic materials, such as silicon nitride or aluminum oxide. The first inorganic layer 103 is a hydrophilic and thin layer. A thickness of the first inorganic layer is 0.1-2 µm, such as 1 µm. The first inorganic layer 103 is formed by utilizing plasma-enhanced chemical vapor deposition (CVD) or atomic layer deposition. The plasma-enhanced CVD utilizes microwave or radio frequency to strip the gas atoms out of the film and form the plasma partially. The plasma is very active in chemistry and reactive to form a film on the substrate as expected. The atomic layer deposition (ALD) is a vapor phase technique used to deposit thin films onto a substrate. The process of ALD involves the surface of a substrate being exposed to be plated with atoms layer-by-layer.

The first inorganic layer 103 is formed on the substrate 101 and the first organic layer 104 is formed on the first inorganic layer 103. The first organic layer 104 is an organic copolymer. Molecules of the organic copolymer have hydrophilic groups and hydrophobic groups. A thickness of the first organic layer 104 is greater than a thickness of the first inorganic layer 103. Preferably, a thickness of the first organic layer 104 is 1-10 µm such as 5 µm. The first organic layer 104 is formed on the first inorganic layer 103 by utilizing a spray technology. The ink used in the spray technology is made of a composition comprising alkenoic acid ester organic substance, alkenoic acid organic substance and photopolymerization initiator. A mass percentage of the alkenoic acid organic substance is 0.1%-10%.

Preferably, methyl methacrylate (MMA), poly acrylic acid (PAA) and photopolymerization initiator are mixed at a certain proportion to form the ink for inkjet printing. A mass percentage of the PAA in the ink is 0.1%-10%. MMA and PAA will have polymerization by the reaction of photopolymerization initiator to form a poly methyl methacrylate-poly acrylic acid (PMMA-PAA) organic layer 104.

In an OLED display panel encapsulation structure, the organic layer is mainly for the flatness and isolation from water and oxygen transmission. The present invention provides a PMMA-PAA organic layer 104 formed by the following process. PAA is amphiphile and easy to bond the first hydrophilic inorganic layer 103. MMA is a hydrophobic and organic polymer and is not easy to bond the first hydrophilic inorganic layer 103. When the printing ink droplets are added to the first inorganic layer 103, the PAA in the droplets without the photopolymerization will be easily spread on the surface. A PAA hydrophilic end of PMMA-PAA formed by the photopolymerization closes to the first inorganic layer 103. A PMMA hydrophobic end of PMMA-PAA is away from the first inorganic layer 103. The spray technology utilizes hydrophilic PAA to easily spread the ink on the first inorganic layer 103 to decrease cavities in the first organic layer 104. Therefore, due to the PMMA-PAA organic layer 104, the OLED display panel encapsulation structure in the present invention has better isolation abilities from water and oxygen.

The first organic layer 104 is formed on the first inorganic layer 103. Then, the second inorganic layer 105 is formed on the first organic layer 104. The second inorganic layer 105 is made of inorganic materials such as silicon nitride, silicon dioxide or aluminum oxide and so on. A thickness of the second inorganic layer 105 is same as a thickness of the first inorganic layer 103. Preferably, the thickness of the second inorganic layer 105 is 0.1-2 µm such as 1 µm by utilizing plasma-enhanced chemical vapor deposition (CVD) or atomic layer deposition method. The first organic layer 104 is fully covered by the second inorganic layer 105. A periphery of the second inorganic layer 105 and a periphery of the first inorganic layer 103 connect with each other to seal the first organic layer 104 by two inorganic layers and to prevent water and oxygen from penetrating into the first organic layer 104.

Figure 2:
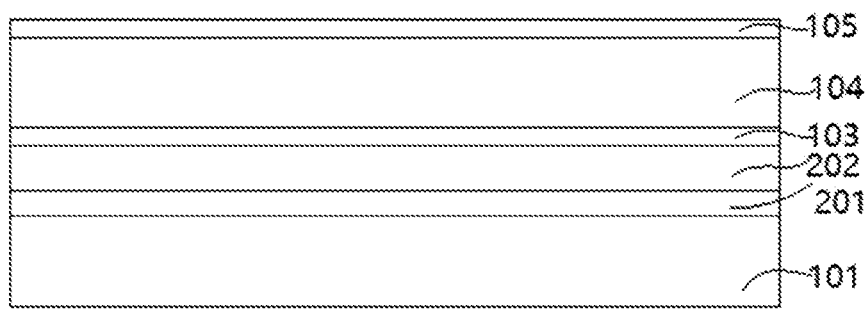
FIG. 2 is a schematic diagram of an OLED display device according to the present invention.

Referring to FIG. 2, an OLED display device comprises a substrate 101, a thin-film transistor driver layer 201, an OLED luminescent layer 202, and an OLED display panel encapsulation structure. The OLED display panel encapsulation structure comprises a first inorganic layer 103, a first organic layer 104 and a second inorganic layer 105 stacked with one another. The organic layer 104 is an ambipolar layer. The ambipolar layer is an organic copolymer. Molecules of the organic copolymer have hydrophilic groups and hydrophobic groups. The OLED display device has a similar structure as the embodiment of the OLED display panel encapsulation structure described above.

The present invention provides an OLED display panel encapsulation structure. By utilizing the organic layer as an ambipolar layer to decrease the cavities in the organic layer. Thus, the organic layer is able to isolate water and oxygen better from the OLED device and to reduce oxidation risk of OLED device and result in longer product life of the OLED device.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

The invention claimed is:

1. An organic light emitting diode (OLED) display panel encapsulation structure, comprising:
a first inorganic layer, a poly methyl methacrylate-poly acrylic acid (PMMA-PAA) organic layer, and a second inorganic layer stacked with one another;
wherein the PMMA-PAA organic layer is an ambipolar layer and the ambipolar layer is made of organic copolymer; molecules of the organic copolymer have hydrophilic groups and hydrophobic groups, and the hydrophilic groups are close to the first inorganic layer, and the hydrophobic groups are away from the first inorganic layer; and
a periphery of the second inorganic layer and a periphery of the first inorganic layer connect with each other.

2. The OLED display panel encapsulation structure according to claim 1, wherein the first inorganic layer is made of silicon nitride or aluminum oxide.

3. The OLED display panel encapsulation structure according to claim 1, wherein the second inorganic layer is made of silicon nitride or silicon dioxide.

4. The OLED display panel encapsulation structure according to claim 1, wherein a thickness of the first inorganic layer is 0.1-2 μm.

5. The OLED display panel encapsulation structure according to claim 1, wherein a thickness of the PMMA-PAA organic layer is greater than a thickness of the first inorganic layer; and a thickness of the second inorganic layer is same as a thickness of the first inorganic layer.

6. The OLED display panel encapsulation structure according to claim 5, wherein the PMMA-PAA organic layer on the first inorganic layer comprising ink, and the ink is made of a composition comprising an alkenoic acid ester organic substance, an alkenoic acid organic substance and a photopolymerization initiator.

7. The OLED display panel encapsulation structure according to claim 6, wherein the alkenoic acid ester organic substance is methyl methacrylate (MMA) and the alkenoic acid organic substance is poly acrylic acid (PAA).

8. The OLED display panel encapsulation structure according to claim 7, wherein a mass percentage of the PAA is 0.1%-10%.

9. An organic light emitting diode (OLED) display device, comprising:
a substrate, a thin-film transistor driver layer, an OLED luminescent layer and an OLED display panel encapsulation structure;
wherein, the OLED display panel encapsulation structure comprises:
a first inorganic layer, a poly methyl methacrylate-poly acrylic acid (PMMA-PAA) organic layer and a second inorganic layer stacked with one another; and
wherein, the PMMA-PAA organic layer is an ambipolar layer, the ambipolar layer is made of organic copolymer; and molecules of the organic copolymer have hydrophilic groups and hydrophobic groups, and the hydrophilic groups are close to the first inorganic layer, and the hydrophobic groups are away from the first inorganic layer.

10. An organic light emitting diode (OLED) display panel encapsulation structure, comprising:
a first inorganic layer, a poly methyl methacrylate-poly acrylic acid (PMMA-PAA) organic layer and a second inorganic layer stacked with one another, wherein the PMMA-PAA organic layer is an ambipolar layer, the ambipolar layer is made of organic copolymer; and molecules of the organic copolymer have hydrophilic groups and hydrophobic groups, and the hydrophilic groups are close to the first inorganic layer, and the hydrophobic groups are away from the first inorganic layer.

11. The OLED display panel encapsulation structure according to claim 10, wherein the first inorganic layer is made of silicon nitride or aluminum oxide.

12. The OLED display panel encapsulation structure according to claim 10, wherein the second inorganic layer is made of silicon nitride or silicon dioxide.

13. The OLED display panel encapsulation structure according to claim 10, wherein a thickness of the first inorganic layer is 0.1-2 μm.

14. The OLED display panel encapsulation structure according to claim 10, wherein a thickness of the PMMA-PAA organic layer is greater than a thickness of the first inorganic layer; and a thickness of the second inorganic layer is same as a thickness of the first inorganic layer.

15. The OLED display panel encapsulation structure according to claim 14, wherein the PMMA-PAA organic layer on the first inorganic layer comprising ink, and the ink is made of a composition comprising an alkenoic acid ester organic substance, an alkenoic acid organic substance and a photopolymerization initiator.

16. The OLED display panel encapsulation structure according to claim 15, wherein the alkenoic acid ester organic substance is methyl methacrylate (MMA), the alkenoic acid organic substance is poly acrylic acid (PAA).

17. The OLED display panel encapsulation structure according to claim 16, wherein a mass percentage of the PAA is 0.1%-10%.

* * * * *